(12) United States Patent  
Chen et al.

(10) Patent No.: US 9,940,875 B2  
(45) Date of Patent: Apr. 10, 2018

(54) SHIFT REGISTER UNIT AND DRIVING METHOD THEREOF, GATE DRIVING CIRCUIT AND DISPLAY APPARATUS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Yipeng Chen, Beijing (CN); Yi Zhang, Beijing (CN); Minghua Xuan, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 130 days.

(21) Appl. No.: 15/131,470

(22) Filed: Apr. 18, 2016

(65) Prior Publication Data

US 2017/0004775 A1     Jan. 5, 2017

(30) Foreign Application Priority Data

Jul. 1, 2015   (CN) .......................... 2015 1 0379790

(51) Int. Cl.

| | |
|---|---|
| *G11C 19/00* | (2006.01) |
| *G09G 3/3266* | (2016.01) |
| *G11C 19/28* | (2006.01) |
| *G11C 19/18* | (2006.01) |

(Continued)

(52) U.S. Cl.  
CPC ......... *G09G 3/3266* (2013.01); *G09G 3/3233* (2013.01); *G11C 19/184* (2013.01); *G11C 19/28* (2013.01); *G09G 3/3677* (2013.01); *G09G 2310/0286* (2013.01); *G09G 2310/08* (2013.01)

(58) Field of Classification Search  
None  
See application file for complete search history.

(56) References Cited

U.S. PATENT DOCUMENTS

| | | | |
|---|---|---|---|
| 2013/0222352 A1* | 8/2013 | Jeong | G09G 3/3266 345/205 |
| 2015/0042383 A1* | 2/2015 | Kwon | G09G 3/3266 327/108 |

(Continued)

*Primary Examiner* — Tuan T Lam  
(74) *Attorney, Agent, or Firm* — Ladas & Parry LLP

(57) ABSTRACT

Embodiments of the present disclosure provide a shift register unit and a driving method thereof, a gate driving circuit and a display apparatus. The shift register unit includes a reset signal sub-unit and a scan signal sub-unit. The reset signal sub-unit includes a first input module, a first output module, and a first control module. The scan signal sub-unit includes a second input module, a second output module, and a second control module. The first input module is connected with the first control module, the first output module, and a signal input terminal. Both the first output module and the first control are connected with the scan signal sub-unit and a reset signal terminal. The second input module is also connected with the second output module and the second control module. Both the second output module and the second control module are connected with a signal output terminal.

20 Claims, 9 Drawing Sheets

(51) Int. Cl.
*G09G 3/3233* (2016.01)
*G09G 3/36* (2006.01)

(56) References Cited

U.S. PATENT DOCUMENTS

| | | | |
|---|---|---|---|
| 2015/0061982 A1* | 3/2015 | Woo | G09G 3/3266 345/82 |
| 2016/0042691 A1* | 2/2016 | Na | G09G 3/3266 345/205 |
| 2016/0163401 A1* | 6/2016 | Nonaka | G11C 19/28 345/214 |
| 2016/0284263 A1* | 9/2016 | Ma | G11C 19/28 |
| 2016/0372204 A1* | 12/2016 | Lee | G11C 16/16 |
| 2016/0379558 A1* | 12/2016 | Jeon | G09G 3/3225 345/213 |
| 2017/0206823 A1* | 7/2017 | Bian | G09G 3/2092 |

\* cited by examiner

SHIFT REGISTER UNIT AND DRIVING METHOD THEREOF, GATE DRIVING CIRCUIT AND DISPLAY APPARATUS

This application claims the benefit under 35 U.S.C. § 119(a) of Chinese Patent Application No. 201510379790.3, filed on Jul. 1, 2015, the entire disclosures of which are incorporated herein by references for all purposes.

TECHNICAL FIELD

The present disclosure relates to a technical field of display technology, and particularly to a shift register unit and a driving method thereof, a gate driving circuit and a display apparatus.

BACKGROUND ART

With the rapid development of display technology, semiconductor element technology has made progress in leaps and bounds therewith as the core of a display apparatus. As to existing display apparatuss, the OLED (Organic Light Emitting Diode), which is a current mode light-emitting device, is more and more applied to the field of high performance display, due to its characteristics of autoluminescence, quick response, wide angle of view, capability of being made on a flexible substrate, etc.

An OLED display panel constituted by OLED devices is a current driving device. A brightness of a pixel unit is controlled by controlling a current flowing into the OLED device in every pixel unit. In the pixel unit, there set a pixel circuit, which, as shown in FIG. 1, may at least include a switch transistor M1 (TFT, Thin Film Transistor) for receiving a line scan signal GATE, a driving transistor M2 for driving an OLED device to emit light, and a storage capacitor C' for storing charges. Particularly, when the switch transistor M1 is turned on, a data signal DATA may be output to a gate of the driving transistor M2, and the driving transistor M2 is made to drive the OLED device to emit light under the function of a supply voltage VDD.

In a display process of the OLED panel, in order to avoid an impact on the display of present frame of picture caused by voltages remained at the gate of the driving transistor M2 and across the storage capacitor C', it's required to input a reset signal RESET to the above pixel circuit so as to release the voltages at the gate of the driving transistor M2 and across the storage capacitor C'. Bonding technology is required, through which a driving circuit capable of providing the reset signal RESET needs to be bonded to a non-display area of the OLED display panel while a driving circuit capable of providing the above line scan signal GATE is bonded to the non-display area of the OLED display panel. And it's also necessary to provide voltage signal and clock signal respectively for the above two driving circuits. Therefore, it may result in a complex circuit structure of the driving part and an increasing cost, and is also adverse to a design of narrow frame.

SUMMARY

Embodiments of the present disclosure provide a shift register unit and a driving method thereof, a gate driving circuit and a display apparatus, which are able to solve problems of cost increase and being adverse to narrow frame design caused by adopting bonding technology in an OLED display device.

In order to achieve the above purpose, embodiments of the present disclosure adopt technical solutions as below.

In a first aspect of embodiments of the present disclosure, a shift register unit is provided. The shift register unit may include a reset signal sub-unit and a scan signal sub-unit. The reset signal sub-unit may include a first input module, a first output module and a first control module. The first input module is connected with a signal input terminal, a first clock signal terminal, the first control module, and the first output module, and is used for outputting a signal at the signal input terminal to the first output module and the first control module under the control of the first clock signal terminal. The first output module is also connected with a second clock signal terminal, a first voltage terminal, a reset signal terminal, and the scan signal sub-unit, and is used for outputting a signal at the second clock signal terminal to the scan signal sub-unit and the reset signal terminal under the control of the first voltage terminal and the first input module. The first control module is further connected with the first voltage terminal, the first clock signal terminal, a second voltage terminal, the reset signal terminal, and the scan signal sub-unit, and is used for outputting a voltage signal at the second voltage terminal to the scan signal sub-unit and the reset signal terminal under the control of the first voltage terminal, the first clock signal terminal and the first input module. The scan signal sub-unit may include a second input module, a second output module and a second control module. The second input module is connected with the first output module, the first control module, the reset signal terminal, the second clock signal terminal, the second output module, and the second control module, and is used for outputting a signal at the first output module, the first control module, or the reset signal terminal to the second output module and the second control module under the control of the second clock signal terminal. The second output module is also connected with the first clock signal terminal, the first voltage terminal, and a signal output terminal, and is used for outputting a signal at the first clock signal terminal to the signal output terminal under the control of the first voltage terminal and the second input module. The second control module is also connected with the second voltage terminal, the first voltage terminal, the second clock signal terminal, and the signal output terminal, and is used for outputting a voltage signal at the second voltage terminal to the signal output terminal under the control of the first voltage terminal, the second clock signal terminal and the second input module.

In combination with the first aspect and in one implementation thereof, the first input module may include a first transistor. The first transistor has a gate connected with the first clock signal terminal, a first electrode connected with the signal input terminal, and a second electrode connected with the first output module and the first control module.

In combination with the first aspect and the above implementation, in another implementation of the first aspect, the first output module may include: a second transistor, a third transistor and a first capacitor. The second transistor has a gate connected with the first voltage terminal, a first electrode connected with the first input module, and a second electrode connected with a gate of the third transistor. The third transistor has a first electrode connected with the second clock signal terminal, and a second electrode connected with the scan signal sub-unit and the reset signal terminal. The first capacitor has one terminal connected with the gate of the third transistor, and another terminal connected with the second electrode of the third transistor.

In combination with the first aspect and the above implementation, in yet another implementation of the first aspect, the first control module may include: a fourth transistor, a fifth transistor, a sixth transistor and a second capacitor. The fourth transistor has a gate connected with the first input module, a first electrode connected with the first clock signal terminal, and a second electrode connected with a second electrode of the fifth transistor. The fifth transistor has a gate connected with the first clock signal terminal, a first electrode connected with the first voltage terminal. The sixth transistor has a gate connected with the second electrode of the fourth transistor, a first electrode connected with the second voltage terminal, a second electrode connected with the scan signal sub-unit and the reset signal terminal. The second capacitor has one terminal connected with the gate of the sixth transistor, and another terminal connected with the first electrode of the sixth transistor.

In combination with the first aspect and the above implementation, in yet another implementation of the first aspect, the second input module may include: a seventh transistor, which has a gate connected with the second clock signal terminal, a first electrode connected with the first output module, the first control module, and the reset signal terminal.

In combination with the first aspect and the above implementation, in yet another implementation of the first aspect, the second output module may include: a eighth transistor, a ninth transistor and a third capacitor. The eighth transistor has a gate connected with the first voltage terminal, a first electrode connected with the second input module, and a second electrode connected with a gate of the ninth transistor. The ninth transistor has a first electrode connected with the first clock signal terminal, and a second electrode connected with the signal output terminal. The third capacitor has one terminal connected with the gate of the ninth transistor, and another terminal connected with the second electrode of the ninth transistor.

In combination with the first aspect and the above implementation, in yet another implementation of the first aspect, the second control module may include: a tenth transistor, an eleventh transistor, a twelfth transistor and a fourth capacitor. The tenth transistor has a gate connected with the second input module, a first electrode connected with the second clock signal terminal, and a second electrode connected with a second electrode of the eleventh transistor. The eleventh transistor has a gate connected with the second clock signal terminal, a first electrode connected with the first voltage terminal. The twelfth transistor has a gate connected with the second electrode of the tenth transistor, a first electrode connected with the second voltage terminal, a second electrode connected with the signal output terminal. The fourth capacitor has one terminal connected with the gate of the twelfth transistor, and another terminal connected with the first electrode of the twelfth transistor.

According to a second aspect of embodiments of the present disclosure, a gate driving circuit is provided. The gate driving circuit includes at least two stages of any shift register unit as mentioned above. A signal input terminal of a first stage of shift register unit is connected with an initial signal terminal. Except the first stage of shift register unit, a signal input terminal of every other shift register unit is connected with a signal output terminal of its adjacent previous stage of shift register unit.

According to a third aspect of embodiments of the present disclosure, a display apparatus including the above gate driving circuit is provided.

According to a fourth aspect of embodiments of the present disclosure, a driving method of a shift register unit is provided. The driving method includes: a first phase, a second phase, a third phase, and a fourth phase.

In the first phase, a first input module outputs a signal at a signal input terminal to a first output module and a first control module; the first output module stores a signal at the signal input terminal and outputs a signal at a second clock signal terminal to a second input module and a reset signal terminal; the first control module stores a signal at a first clock signal terminal and outputs a voltage signal at a second voltage terminal to the second input module and the reset signal terminal; the second input module is turned off with no signal inputted to a second output module and a second control module and no signal outputted at a signal output terminal.

In the second phase, the first input module is turned off, and the first output module outputs a signal at the second clock signal terminal to the second input module and the reset signal terminal under the control of the signal stored in the first phase; the first control unit has no signal to output to the second input module and the reset signal terminal; the second input module outputs a received signal at the second clock signal terminal to the second output module and the second control module; the second output module stores a signal at the second clock signal terminal and outputs a signal at the first clock signal terminal to the signal output terminal under the control of the second clock signal terminal; the second control module stores a signal at the second clock signal terminal and outputs a voltage signal at the second voltage terminal to the signal output terminal under the control of the second clock signal terminal.

In the third phase, the first input module outputs a signal at the signal input terminal to the first output module and the first control module; the first output module stores a signal at the signal input terminal; the first control module stores a voltage signal at the first voltage terminal and outputs a voltage signal at the second voltage terminal to the second input module and the reset signal terminal under the control of the first voltage terminal; the second input module is turned off, and the second output module outputs a signal at the first clock signal terminal to the signal output terminal under the control of the signal stored in the second phase; the second control module has no signal to output to the signal output terminal.

In the fourth phase, the first input module is turned off, and the first output module has no signal to output to the second input module under the control of the signal stored in the third phase; the first control module stores a voltage signal at the first voltage terminal under the control of the first clock signal terminal and outputs a voltage signal at the second voltage terminal to the second input module and the reset signal terminal under the control of the first voltage terminal; the second input module outputs a received signal at the second voltage terminal to the second output module and the second control module; the second output module has no signal to output to the signal output terminal under the control of the second voltage terminal; the second control module outputs a signal at the second voltage terminal to the signal output terminal under the control of the second voltage terminal and the first voltage terminal.

By utilizing the technical solutions of embodiments of the present disclosure, on one hand, the reset signal sub-unit may output a reset signal to the reset signal terminal according to a signal input at the signal input terminal, so as to reset a gate of a driving transistor and two terminals of a storage capacitor in a pixel unit connected with the shift register unit, avoiding an impact on the display of present frame of image caused by voltages remained at the gate of the driving transistor and across the storage capacitor C'; on the other hand, since the output terminal of the reset signal sub-unit is connected with the scan signal sub-unit, the above reset signal may also be used as an input signal for the scan signal sub-unit, making the scan signal sub-unit output a line scan signal to the signal output terminal according to the input signal, so as to scan a pixel unit connected with the shift register unit. In summary, the above shift register unit can not only provide a line scan signal for a pixel circuit connected with it, but also provide a reset signal, and the shift register unit can simultaneously provide the reset signal sub-unit and the scan signal sub-unit with clock signals only with two clock signal terminals. Thus, the circuit has a simple structure, in favor of cost reduction and narrow frame design.

BRIEF DESCRIPTION OF THE DRAWINGS

In order to more clearly illustrate the technical solutions of embodiments of the present disclosure or the prior art, drawings necessary for the description of embodiments or the prior art are briefly introduced below. The drawings described below are merely some embodiments of the present disclosure, a person of ordinary skill in the art can also obtain other drawings according to these drawings.

10—a reset signal sub-unit; 101—a first input module; 102—a first output module; 103—a first control module; 20—a scan signal sub-unit; 201—a second input module; 202—a second output module; 203—a second control module.

DETAILED DESCRIPTION

The technical solutions of embodiments of the present disclosure will be described clearly and completely below in combination with the drawings in the embodiments of the present disclosure. The described embodiments are merely part of embodiments of the present disclosure, but not all embodiments. Based on embodiments of the present disclosure, all the other embodiments that a person of ordinary skill in the art may obtain belong to the protection scope of the present disclosure.

Figure 1:
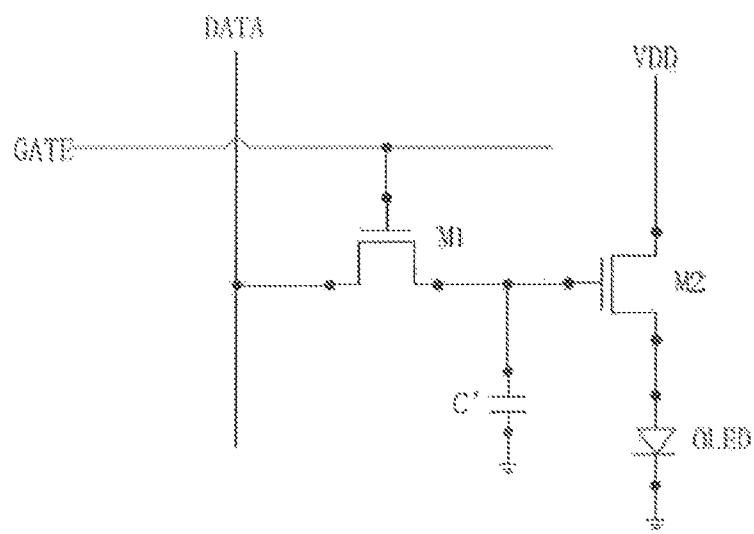
FIG. 1 is a schematic structural diagram of a pixel circuit provided by the prior art.
Figure 2:
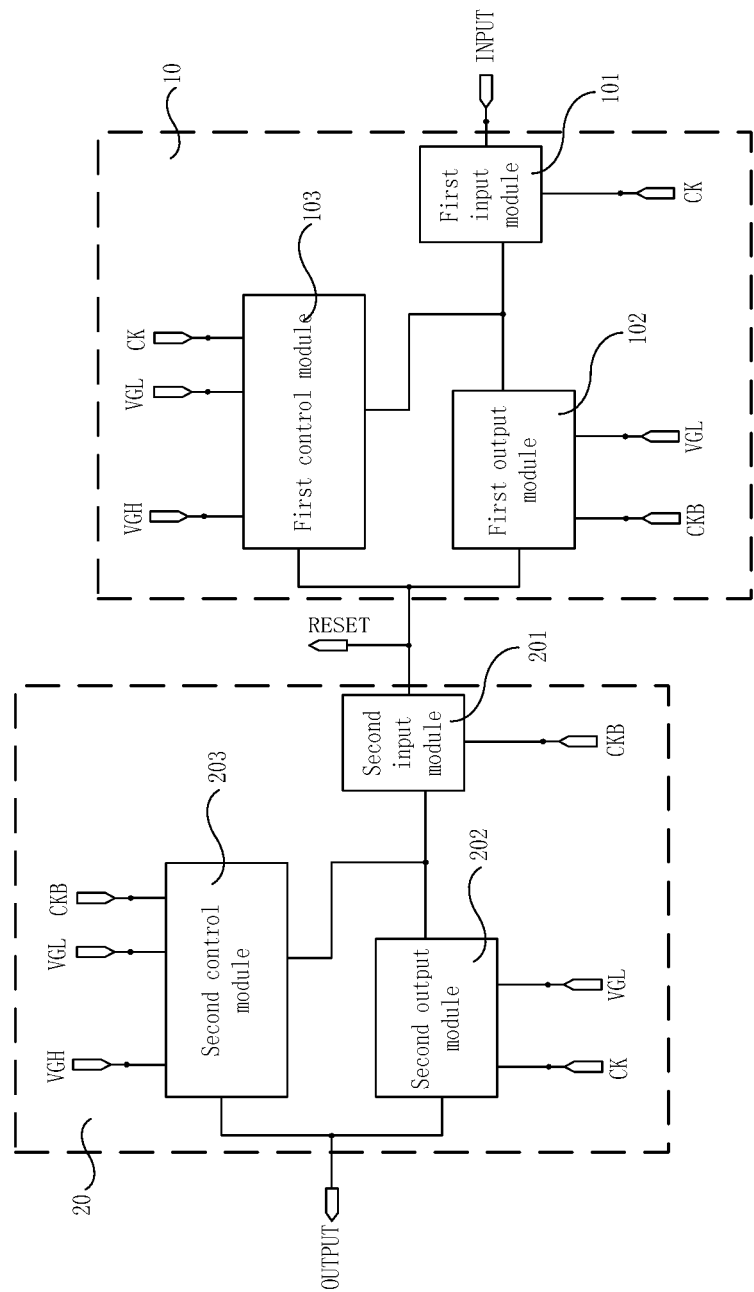
FIG. 2 is a schematic structural diagram of a shift register unit provided by an embodiment of the present disclosure.

An embodiment of the present disclosure provides a shift register unit as shown in FIG. 2. The shift register unit may include: a reset signal sub-unit 10 and a scan signal sub-unit 20.

The reset signal sub-unit 10 may include: a first input module 101, a first output module 102, and a first control module 103.

The first input module 101 is connected with a signal input terminal INPUT, a first clock signal terminal CK, a first control module 103, and a first output module 102. The first input module 101 outputs a signal at the signal input terminal INPUT to the first output module 102 and the first control module 103 under the control of the first clock signal terminal CK.

The first output module 102 is also connected with a second clock signal terminal CKB, a first voltage terminal VGL, a reset signal terminal RESET, and a scan signal sub-unit 20. The first output module 102 outputs a signal at the second clock signal terminal CKB to the scan signal sub-unit 20 and the reset signal terminal RESET under the control of the first voltage terminal VGL and the first input module 101.

The first control module 103 is also connected with the first voltage terminal VGL, the clock signal terminal CK, the second voltage terminal VGH, the reset signal terminal RESET, and the scan signal sub-unit 20. The first control module 103 outputs a voltage signal at the second voltage terminal VGH to the scan signal sub-unit 20 and the reset signal terminal RESET under the control of the first voltage terminal VGL, the first clock signal terminal CK, and the first input module 101.

The scan signal sub-unit 20 may include: a second input module 201, a second output module 202, and a second control module 203.

The second input module 201 is connected with the first output module 102, the first control module 103, the reset signal terminal RESET, the second clock signal terminal CKB, the second output module 202, and the second control module 203. The second input module 201 outputs signals at the first output module 102, the first control module 103, or the reset signal terminal RESET to the second output module 202 and the second control module 203 under the control of the second clock signal terminal CKB.

The second output module 202 is also connected with the first clock signal terminal CK, the first voltage terminal VGL, and a signal output terminal OUTPUT. The second output module 202 outputs a signal at the first clock signal terminal CK to the signal output terminal OUTPUT under the control of the first voltage terminal VGL and the second input module 201.

The second control module 202 is also connected with the second voltage terminal VGH, the first voltage terminal VGL, the second clock signal terminal CKB, and the signal output terminal OUTPUT. The second control module 202 outputs a voltage signal at the second voltage VGH to the signal output terminal OUTPUT under the control of the first voltage terminal VGL, the second clock signal terminal CKB, and the second input module 201.

Figure 3:
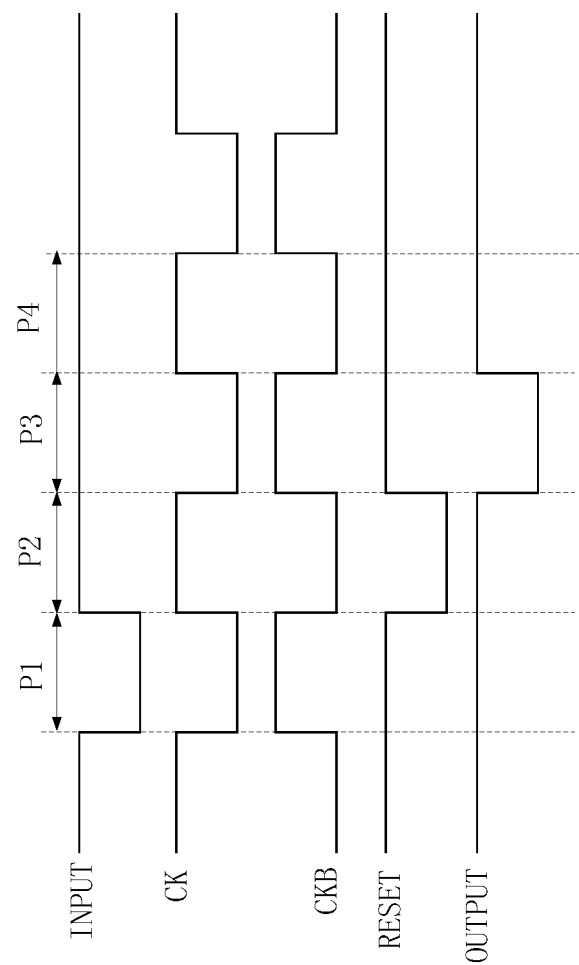
FIG. 3 is a signal timing diagram for controlling the shift register unit shown in FIG. 2 provided by an embodiment of the present disclosure.

It should be noted that, firstly, the embodiment of the present disclosure takes it as example that a low level is input to the first voltage terminal VGL, which is otherwise grounded, and a high level is input to the second voltage terminal VGH; secondly, a signal input to the first clock signal terminal CK has the same width as and the opposite direction to that input to the second clock signal terminal CKB, as shown in FIG. 3.

The shift register unit provided by the embodiment of the present disclosure includes a reset signal sub-unit and a scan signal sub-unit. The reset signal sub-unit includes: a first input module, a first output module, and a first control module. The first input module is connected with a signal input terminal, a first clock signal terminal, the first control module, and the first output module, and is used for outputting a signal at the signal input terminal to the first output module and the first control module under the control of the first clock signal terminal. The first output module is also connected with a second clock signal terminal, a first voltage terminal, a reset signal terminal, and the scan signal sub-unit, and is used for outputting a signal at the second clock signal terminal to the scan signal sub-unit and the reset signal terminal under the control of the first voltage terminal and the first input module. The first control module is also connected with the first voltage terminal, the first clock signal terminal, a second voltage terminal, the reset signal terminal, and the scan signal sub-unit, and is used for outputting a voltage signal at the second voltage terminal to the scan signal sub-unit and the reset signal terminal under the control of the first voltage terminal, the first clock signal terminal and the first input module. The scan signal sub-unit includes: a second input module, a second output module and a second control module. The second input module is connected with the first output module, the first control module, the reset signal terminal, the second clock signal terminal, the second output module, and the second control module, and is used for outputting a signal at the first output module, the first control module or the reset signal terminal to the second output module and the second control module under the control of the second clock signal terminal. The second output module is also connected with the first clock signal terminal, the first voltage terminal and a signal output terminal, and is used for outputting a signal at the first clock signal terminal to the signal output terminal under the control of the first voltage terminal and the second input module. The second control module is also connected with the second voltage terminal, the first voltage terminal, the second clock signal terminal, and the signal output terminal, and is used for outputting a voltage signal at the second voltage terminal to the signal output terminal under the control of the first voltage terminal, the second clock signal terminal and the second input module.

On one hand, the reset signal sub-unit may output a reset signal to the reset signal terminal according to a signal input at the signal input terminal, so as to reset a gate of a driving transistor and two terminals of a storage capacitor in a pixel unit connected with the shift register unit, avoiding an impact on the display of the present frame of image caused by voltages remained at the gate of the driving transistor and across the storage capacitor C'. On the other hand, since the output terminal of the reset signal sub-unit is connected with the scan signal sub-unit, the above reset signal may also be used as an input signal for the scan signal sub-unit, making the scan signal sub-unit output a line scan signal to the signal output terminal, according to the input signal, so as to scan a pixel unit connected with the shift register unit. In summary, the above shift register unit can not only provide a line scan signal for a pixel circuit connected with it, but also provide a reset signal, and the shift register unit can simultaneously provide the reset signal sub-unit and the scan signal sub-unit with clock signals only with two clock signal terminals. Thus, the circuit has a simple structure, in favor of cost reduction and narrow frame design.

Examples are given below for detailed illustration of the structure of the shift register unit.

Figure 4:
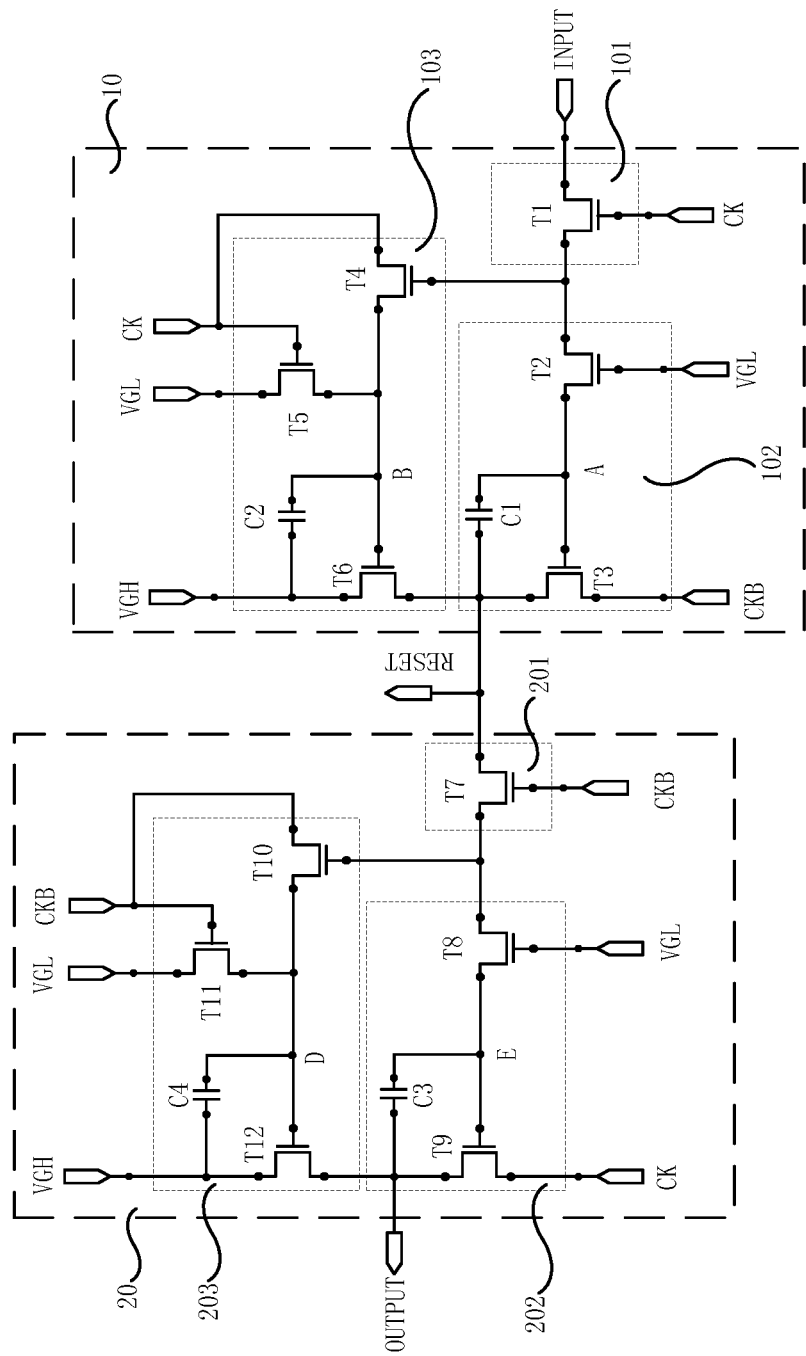
FIG. 4 is a schematic diagram of detailed structure of the shift register unit shown in FIG. 2.

Particularly, a first input module 101, as shown in FIG. 4, may include a first transistor T1, which has a gate connected with a first clock signal terminal CK, a first electrode connected with a signal input terminal INPUT, and a second electrode connected with a first output module 102 and a first control module 103.

The first output module 102 may include: a second transistor T2, a third transistor T3, and a first capacitor C1.

The second transistor T2 has a gate connected with a first voltage terminal VGL, a first electrode connected with the first input module 101, and a second electrode connected with a gate of the third transistor T3. When the first input module 101 has a structure as mentioned above, the first electrode of the second transistor T2 is connected to the second electrode of the first transistor T1.

The third transistor T3 has a first electrode connected with a second clock signal terminal CKB, and a second electrode connected with a scan signal sub-unit 20 and a reset signal terminal RESET.

The first capacitor C1 has one terminal connected with the gate of the third transistor T3, and another terminal connected with the second electrode of the third transistor T3.

The control module 103 may include: a fourth transistor T4, a fifth transistor T5, a sixth transistor T6, and a second capacitor C2.

The fourth transistor T4 has a gate connected with the first input module 101, a first electrode connected with the first clock signal terminal CK, a second electrode connected with a second electrode of the fifth transistor T5. When the first input module 101 has a structure as mentioned above, the gate of the fourth transistor T4 is connected to the second electrode of the first transistor T1.

The fifth transistor T5 has a gate connected with the first clock signal terminal CK, and a first electrode connected with the first voltage terminal VGL.

The sixth transistor T6 has a gate connected with the second electrode of the fourth transistor T4, a first electrode connected with a second voltage terminal VGH, and a second electrode connected with the scan signal sub-unit 20 and the reset signal terminal RESET.

The second capacitor C2 has one terminal connected with the gate of the sixth transistor T6, and another terminal connected with the first electrode of the sixth transistor T6.

A second input module 201 may include a seventh transistor T7, which has a gate connected with the second clock signal terminal CKB, a first electrode connected with the first input module 102, the reset signal terminal RESET, and the first control module 103. When the first output module 102 and the first control module 103 have structures as mentioned above, the gate of the seventh transistor T7 is connected to the second electrode of the sixth transistor T6 and the second electrode of the third transistor T3.

A second output module 202 may include: an eighth transistor T8, a ninth transistor T9, and a third capacitor C3.

The eighth transistor T8 has a gate connected with the first voltage terminal VGL, a first electrode connected with the second input module 201, and a second electrode connected with a gate of the ninth transistor T9. When the second input module 201 has a structure as mentioned above, the first electrode of the eighth transistor T8 is connected to the second electrode of the seventh transistor T7.

The ninth transistor T9 has a first electrode connected with the first clock signal terminal CK, and a second electrode connected with a signal output terminal OUTPUT.

The third capacitor C3 has one terminal connected with the gate of the ninth transistor T9, and another terminal connected with the second electrode of the ninth transistor T9.

A second control module 203 may include: a tenth transistor T10, an eleventh transistor T11, a twelfth transistor T12, and a fourth capacitor C4.

The tenth transistor T10 has a gate connected with the second input module 201, a first electrode connected with the second clock signal terminal CKB, and a second electrode connected with a second electrode of the eleventh transistor T11. When the second input module 201 has a structure as mentioned above, the gate of the tenth transistor T10 is connected to the second electrode of the seventh transistor T7.

The eleventh transistor T11 has a gate connected with the second clock signal terminal CKB, and a first electrode connected with the first voltage terminal VGL.

The twelfth transistor T12 has a gate connected with the second electrode of the tenth transistor T10, a first electrode connected with the second voltage terminal VGH, and a second electrode connected with the signal output terminal OUTPUT.

The fourth capacitor C4 has one terminal connected with the gate of the twelfth transistor T12, and another terminal connected with the first electrode of the twelfth transistor T12.

On this basis, the working principle of the above shift register unit is described in detail according to the signal timing diagram shown in FIG. 3.

In a first phase P1, INPUT=0; CK=0; CKB=1; RESET=1; OUTPUT=1. It should be noted that in the following embodiment, "0" represents a low level; "1" represents a high level. Furthermore, a turned-on circuit is represented with solid line, and a turned-off circuit is represented with dash line.

Figure 5:
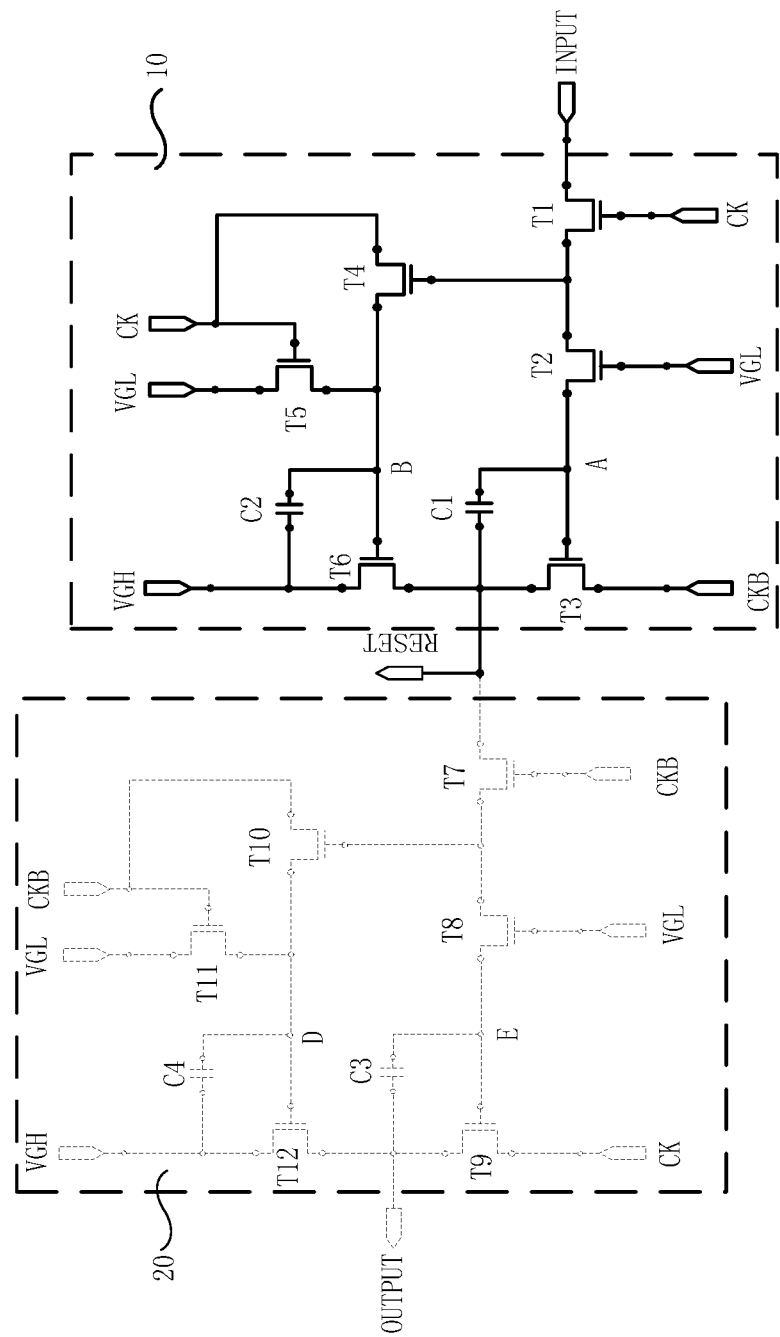
FIG. 5 is an equivalent circuit diagram of the shift register unit shown in FIG. 4 in a first phase P1 in FIG. 3.

In this case, an equivalent circuit diagram is shown in FIG. 5. All the transistors in the reset signal sub-unit 10: the first transistor T1, the second transistor T2, the third transistor T3, the fifth transistor T5, and the sixth transistor T6 are all in On state; thereby, a high level output at the second clock signal terminal CKB and a high level output at the second voltage terminal VGH can be respectively output to the reset signal terminal RESET and the first electrode of the seventh transistor T7 through the third transistor T3 and the sixth transistor T6. Moreover, a low level input at the signal input terminal INPUT may be stored to the first capacitor C1 through the first transistor T1 and the second transistor T2; a low level input at the first clock signal terminal CK may be stored to the second capacitor C2 through the fourth transistor T4.

Moreover, since the seventh transistor is in Off state, there is no signal at the input terminal of the scan signal sub-unit 20; thereby, there is no signal output at the signal output terminal OUTPUT. Therefore, in the first phase, the shift register unit will not output a line scan signal GATE to a pixel unit connected with the shift register unit.

In a second phase P2, INPUT=1; CK=1; CKB=0; RESET=0; OUTPUT=1.

Figure 6:
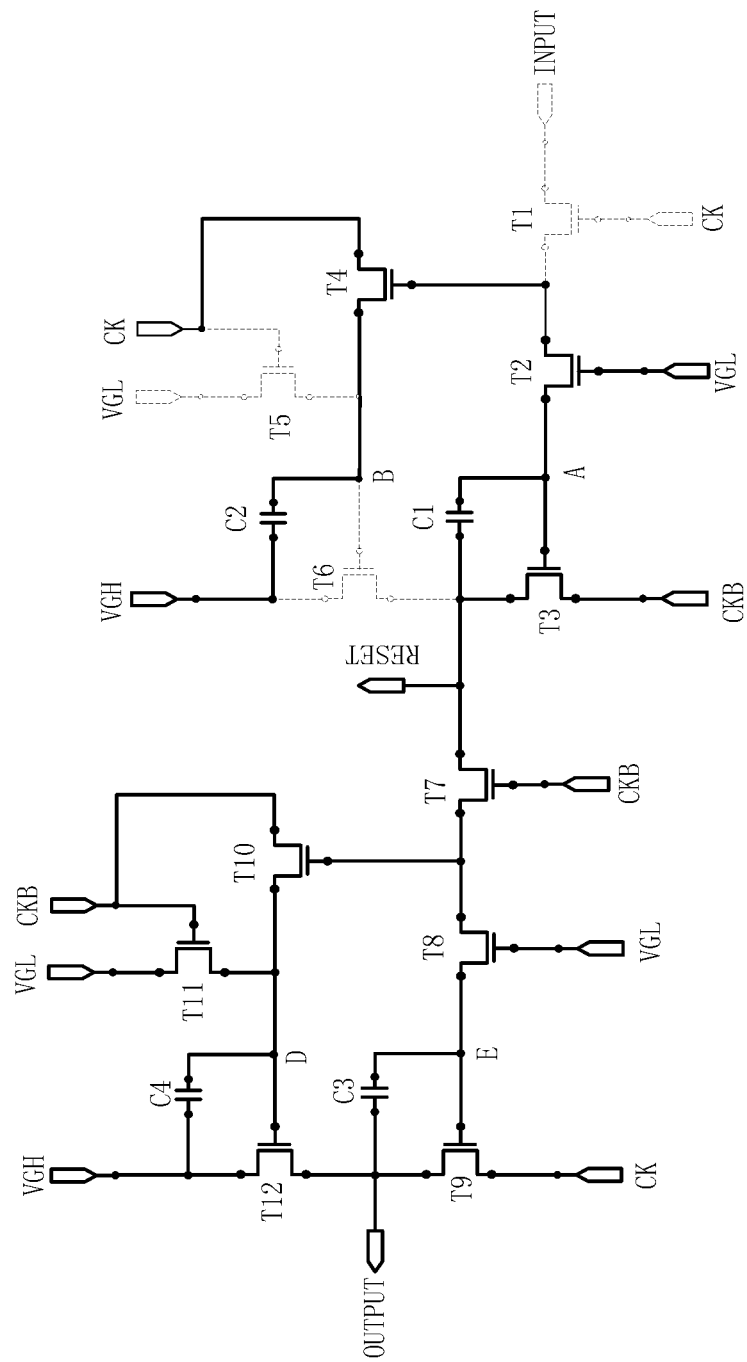
FIG. 6 is an equivalent circuit diagram of the shift register unit shown in FIG. 4 in a second phase P2 in FIG. 3.

In this case, an equivalent circuit diagram is shown in FIG. 6. The first transistor T1 is turned off. The first capacitor C1 outputs the low level stored in the first phase P1 to the gate of the fourth transistor T4 through a node A and the second transistor T2, thereby turning on the fourth transistor T4. At this time, a high level output at the first clock signal terminal CK is output to the gates of the fifth transistor T5 and the sixth transistor T6, and the fifth transistor T5 and the sixth transistor T6 are turned off. Furthermore, the low level stored in the first capacitor C1 is output to the gate of the third transistor T3 through the node A so that the third transistor T3 is in On state, thereby outputting a low level at the second clock signal terminal CKB to the reset signal terminal RESET and the first electrode of the seventh transistor T7.

Since there is a low level at the reset signal terminal RESET, a reset signal can be input to a pixel circuit of a pixel unit connected with the shift register, so as to release voltages at the gate of the driving transistor M2 and across the storage capacitor C', thereby avoiding an impact on the display of the present frame of image caused by voltages remained at the gate of the driving transistor M2 and across the storage capacitor C'.

At the same time, since a low level is input to the second clock signal terminal CKB, the seventh transistor T7 is turned on. In this case, the reset signal sub-unit 10 outputs a low level output at the reset signal terminal RESET to the scan signal sub-unit 20, and all the transistors (T7, T8, T9, T10, T11, and T12) in the scan signal sub-unit 20 are in On state. At this time, a low level input at the first electrode of the seventh transistor T7 is stored to the third capacitor C3 through the eighth transistor T8. And a high level input at the first clock signal terminal CK is output to the signal output terminal OUTPUT through the ninth transistor T9.

Furthermore, a low level input at the second clock signal terminal CKB is stored to the fourth capacitor C4 through the tenth transistor T10, and a low level input at the first voltage terminal VGL is stored to the fourth capacitor C4 through the eleventh transistor T11. And a high level input at the second voltage terminal VGH is output to the signal output terminal OUTPUT through the twelfth transistor 112.

In summary, since a low level is output at the reset signal terminal RESET in the second phase, the shift register is used for inputting a reset signal to a pixel unit connected with it. A high level is output at the signal output terminal OUTPUT, so the shift register unit will not output a line scan signal GATE to a pixel unit connected with it in the second phase.

In a third phase P3, INPUT=1; CK=0; CKB=1; RESET=1; OUTPUT=0.

Figure 7:
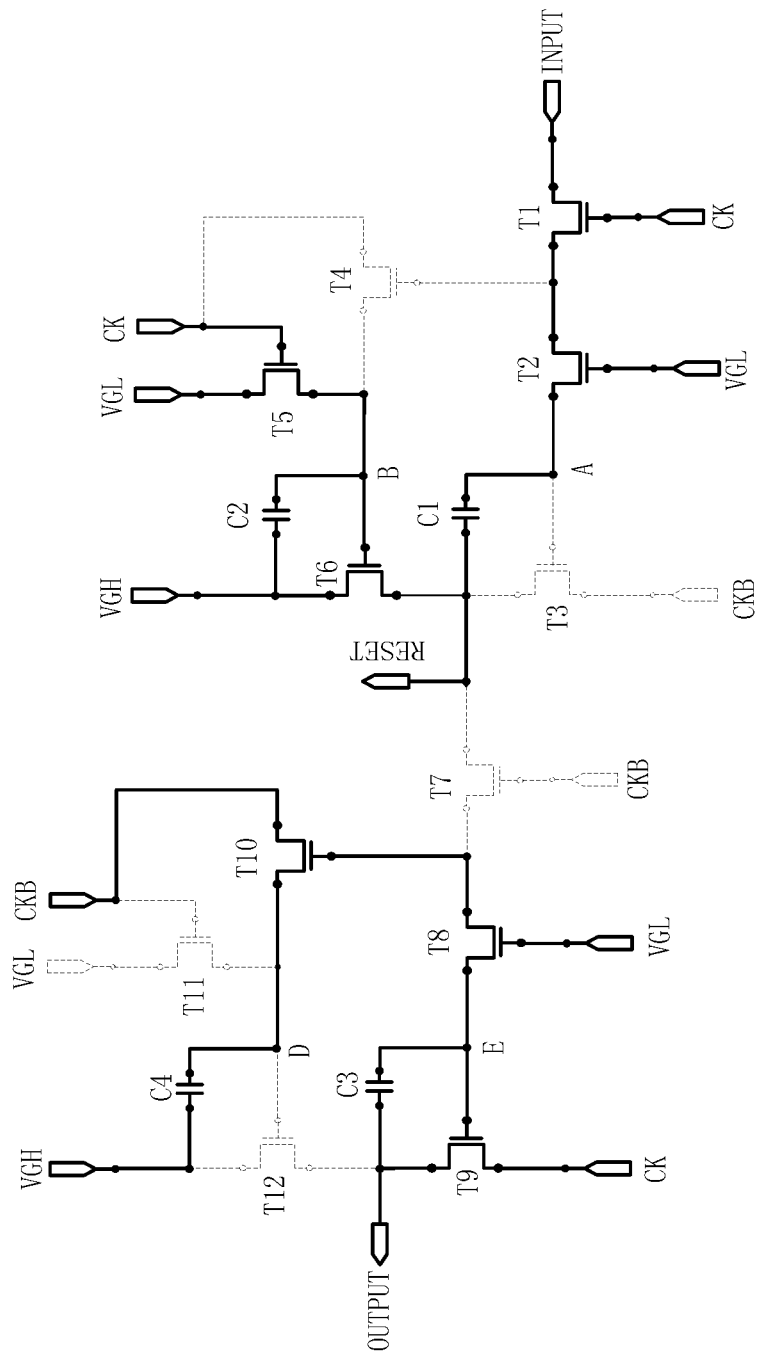
FIG. 7 is an equivalent circuit diagram of the shift register unit shown in FIG. 4 in a third phase P3 in FIG. 3.

In this case, an equivalent circuit diagram is shown in FIG. 7, and the first transistor T1 and the second transistor T2 are in On state so that a high level input at the signal input terminal INPUT is stored to the first capacitor C1 and output to the gate of the third transistor T3, making the third transistor T3 in Off state. Moreover, a high level input at the signal input terminal INPUT makes the fourth transistor T4 in Off state. The fifth transistor T5 is turned on, and a low level input at the first voltage terminal VGL is stored to the second capacitor C2; then, the sixth transistor T6 is turned on so that a high level input at the second voltage terminal VGH is output to the reset signal terminal RESET and the first electrode of the seventh transistor T7.

In this case, since the seventh transistor T7 is in Off state, a high level at the first electrode of the seventh transistor T7 is unable to be input to the scan signal sub-unit 20. At this time, the eighth transistor T8 is turned on, and the third capacitor C3 outputs the low level stored in the second phase P2 to the gate of the tenth transistor T10 through a node E and the eighth transistor T8 so that the tenth transistor T10 is in On state; thus, a high level input at the second clock signal terminal CKB is output to the gate of the twelfth transistor T12 through the tenth transistor T10 so that the twelfth transistor T12 is turned off. At the same time, the third capacitor C3 outputs the low level stored in the second phase P2 to the gate of the ninth transistor T9 through the node E so that a low level input at the first clock signal terminal CK is output to the signal output terminal OUTPUT through the ninth transistor T9. Furthermore, the eleventh transistor T11 is in Off state.

In summary, since a low level is output at the signal output terminal OUTPUT in the third phase, a line scan signal GATE can be output to a pixel unit connected with the shift register unit.

In a fourth phase P4, INPUT=1; CK=1; CKB=0; RESET=1; OUTPUT=1.

Figure 8:
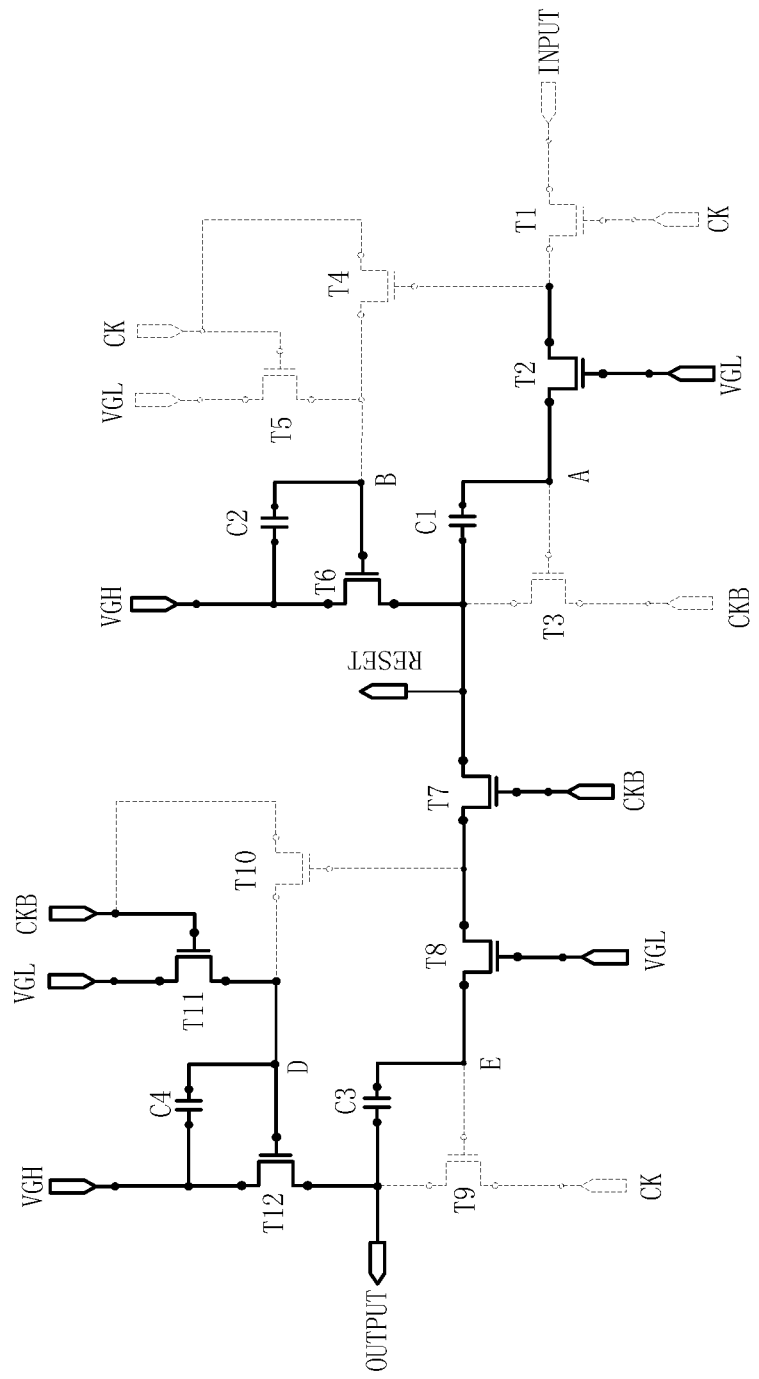
FIG. 8 is an equivalent circuit diagram of the shift register unit shown in FIG. 4 in a fourth phase P4 in FIG. 3.

In this case, an equivalent circuit diagram is shown in FIG. 8. The first transistor T1 is in Off state, and the second transistor T2 is turned on. The first capacitor C1 outputs the high level stored in the third phase P3 to the third transistor T3 through the node A so that the third transistor is in Off state. At the same time, the first capacitor C1 outputs the high level stored in the third phase P3 to the gate of the fourth transistor T4 through the node A and the second transistor T2 so that the fourth transistor T4 is in Off state. Since the first clock signal terminal CK outputs a high level, the fifth transistor T5 is in Off state. Furthermore, the second capacitor C2 outputs the low level stored in the third phase P3 to the gate of the sixth transistor T6 so that the sixth transistor T6 is turned on, thereby outputting a high level input at the second voltage terminal VGH to the reset signal terminal RESET and the first electrode of the seventh transistor T7.

Furthermore, the seventh transistor T7 and the eighth transistor T8 are in On state; thus, the above high level is output to the gate of the ninth transistor T9 through the seventh transistor T7 and the eighth transistor T8, and the ninth transistor T9 is turned off. At the same time, a high level input to the first electrode of the seventh transistor T7 is also output to the gate of the tenth transistor T10 so that the tenth transistor is in Off state. Since the second clock signal terminal inputs a low level, the eleventh transistor T11 is turned on. A low level input at the first voltage terminal VGL is stored to the fourth capacitor C4 through a node D, and the low level is output to the gate of the twelfth transistor T12; thus, the twelfth transistor T12 is turned on, through which a high level input at the second voltage terminal VGH is output to the signal output terminal OUTPUT.

In summary, in the fourth phase, both the reset signal terminal RESET and the signal output terminal OUTPUT of the shift register unit output high levels. Thus, the shift register unit will output neither a reset signal nor a line scan signal to a pixel unit connected with it.

Thereafter, before the display of the next frame of image, both the reset signal terminal RESET and the signal output terminal OUTPUT of the shift register unit output high levels.

It should be noted that the above embodiment of the present disclosure takes it as example that all the transistors in a shift register unit and a pixel unit connected with the shift register unit are P type transistors. Of course, all the transistors provided by the embodiment of the present disclosure can be N type. In this case, the modules or transistors connected with the first voltage terminal VGL in FIG. 2 and FIG. 4 need to be connected to the second voltage terminal VGH, and the modules or transistors connected with the second voltage terminal VGH need to be connected to the first voltage terminal VGL. Furthermore, the control signal in FIG. 4 needs to be reversed. When the above transistors are all N type, the shift register unit has the same working process as the case when all the transistors are P type, which will not be repeated any more.

On this basis, a gate driving circuit (GOA circuit for short below) may consist of at least two stages of above shift register units.

Figure 9:
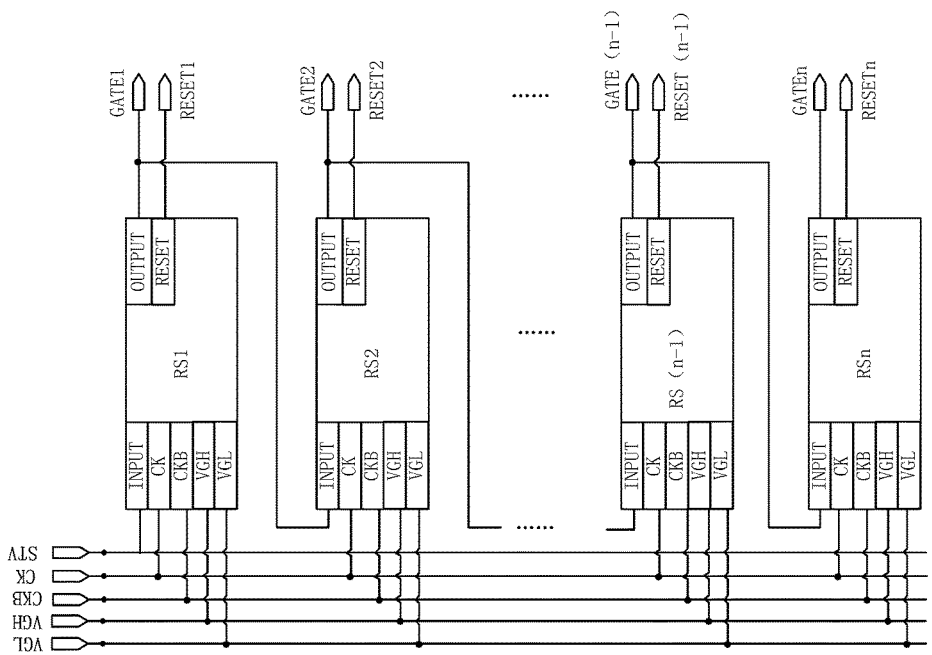
FIG. 9 is a schematic structural diagram of a gate driving circuit formed by cascading the shift register unit shown in FIG. 2.

Particularly, as shown in FIG. 9, a signal input terminal INPUT of a first stage of shift register unit RS1 is connected with an initial signal terminal STV. When the initial signal terminal STV inputs an initial signal, it represents that a frame of image starts to display, and the GOA circuit implements progressive scan to every gate line.

Except the first stage of shift register unit RS1, the input signal terminal of every other shift register unit (RS2, RS3, . . . , RSn) is connected with the signal output terminal OUTPUT of its adjacent previous stage of shift register unit.

Thus, every stage of shift register unit may provide a line scan signal GATE and a reset signal RESET to a pixel unit on the same line. For example, the first stage of shift register unit RS1 may provide a line scan GATE1 and a reset signal RESET1 to a pixel unit on the first line, thereby driving pixel units to emit light line by line.

It should be noted that the shift register unit in the above gate driving circuit has the same structure and beneficial effects as the shift register unit provided by the aforementioned embodiment. Since the structure and advantages of the shift register unit have been described in detail in the aforementioned embodiment, it won't be repeated any more.

An embodiment of the present disclosure provides a display apparatus, including a gate driving circuit as mentioned above. It has the same structure and beneficial effects as the gate driving circuit provided by the aforementioned embodiment. Since the structure and advantages of the gate driving circuit have been described in detail in the aforementioned embodiment, it won't be repeated any more.

It should be noted that in the embodiment of the present disclosure, a display apparatus may specifically include an OLED display apparatus. For example, the display apparatus may be any product or component with the function of display, such as a television, a digital photo frame, a mobile phone, or a tablet, etc.

An embodiment of the present disclosure provides a driving method of a shift register unit. The shift register unit may have a structure in combination with the description in FIG. 2 or FIG. 4. The driving method may include a first phase to a fourth phase in combination with the description in FIG. 3.

In a first phase P1 as shown in FIG. 3, a first input module 101, as shown in FIG. 2, outputs a signal at the signal input terminal INPUT to a first output module 102 and a first control module 103. The first output module 102 stores the signal at the signal input INPUT and outputs a signal at a second clock signal terminal CKB to a second input module 201 and a reset signal terminal RESET. The first control module 103 stores a signal at a first clock signal terminal CK and outputs a voltage signal at s second voltage terminal VGH to the second input module and the reset signal terminal RESET.

The second input module 201 is turned off. There is no signal input to a second module 202 and a second control module 203, and there is no signal output at a signal output terminal OUTPUT.

In a second phase P2, the first input module 101 is turned off, and the first output module 102 outputs a signal at the second clock signal terminal CKB to the second input module 201 and the reset signal terminal RESET under the signal stored in the first phase P1; the first control unit 103 has no signal to output to the second input module 201 and the reset signal terminal RESET.

In the second phase, when the transistors in a pixel circuit connected with the shift register unit are all P type transistors, the second clock signal terminal CKB outputs a low level so that the shift register unit inputs a low level to the pixel circuit connected with the shift register unit through the reset signal terminal RESET, to reset the pixel circuit. When the transistors in a pixel circuit connected with the shift register unit are all N type transistors, the direction of the control signal as shown in FIG. 3 can be reversed, and the shift register unit has the same working principle as above.

The second input module 201 outputs a received signal at the second clock signal terminal CKB to the second output module 202 and the second control module 203. The second output module 202 stores a signal at the second clock signal terminal CKB and outputs a signal at the first clock signal terminal CK to the signal output terminal OUTPUT under the control of the second clock signal terminal CKB. The second control module 203 stores a signal at the second clock signal terminal CKB and outputs a voltage signal at the second voltage terminal VGH to the signal output terminal OUTPUT under the control of the second clock signal terminal CKB.

In summary, the shift register unit can output a reset signal to a pixel circuit connected with it in this phase.

In a third phase P3, the first input module 101 outputs a signal at the signal input terminal INPUT to the first output module 102 and the first control module 103. The first output module 102 stores a signal at the signal input terminal INPUT. The first control module 103 stores a voltage signal at the first voltage terminal VGL and outputs a voltage signal at the second voltage terminal VGH to the second input module 201 and the reset signal terminal RESET under the control of the first voltage terminal VGL.

The second input module 210 is turned off, and the second output module 202 outputs a signal at the first clock signal terminal CK to the signal output terminal OUTPUT under the control of the signal stored in the second phase P2. The second control module 203 has no signal to output to the signal output terminal OUTPUT.

As shown in FIG. 3, in the third phase, the first clock signal terminal CK outputs a low level, and the signal output terminal OUTPUT outputs a low level so that the shift register unit can output a line scan signal GATE to a pixel circuit connected with it.

In a fourth phase P4, the first input module 101 is turned off, and the first output module 102 has no signal to output to the second input module 201 under the control of the signal stored in the third phase P3. The first control module 103 stores a voltage signal at the first voltage terminal VGL under the control of the first clock signal terminal CK and outputs a voltage signal at the second voltage terminal VGH to the second input module 201 and the reset signal terminal RESET under the control of the first voltage terminal VGL. Since the second voltage terminal VGH outputs a high level, the reset signal terminal RESET of the shift register unit outputs a high level in the phase.

The second input module 201 outputs a received voltage signal at the second voltage terminal VGH to the second output module 202 and the second control module 203. The second output module 202 has no signal to output to the signal output terminal OUTPUT under the control of the second voltage terminal VGH. The second control module 203 outputs a signal at the second voltage terminal VGH to the signal output terminal OUTPUT under the control of the second voltage terminal VGH and the first voltage terminal VGL. Since the second voltage terminal VGH outputs a high level, the signal output terminal OUTPUT of the shift register unit outputs a high level in the fourth phase.

Thereafter, before the display of the next frame of image, the reset signal terminal RESET and the signal output terminal OUTPUT of the shift register unit output high levels.

By utilizing the driving method provided by the embodiment of the present disclosure, on one hand, a reset signal may be outputted to a reset signal terminal of a shift register according to a signal at a signal input terminal, so as to reset a gate of a driving transistor and two terminals of a storage capacitor in a pixel unit connected with the shift register unit, avoiding an impact on the display of the present frame of image caused by voltages remained at the gate of the driving transistor and across the storage capacitor C'; on the other hand, since the above reset signal terminal is connected with the second input module, the above reset signal may also be used as an input signal for the second input module, making the shift register unit output a line scan signal to the signal output terminal, according to the input signal, so as to scan a pixel unit connected with the shift register unit. In summary, the above shift register unit can not only provide a line scan signal for a pixel circuit connected with it, but also provide a reset signal, and the shift register unit can simultaneously provide a reset signal sub-unit and a scan signal sub-unit with clock signals only with two clock signal terminals. Thus, the circuit has a simple structure, in favor of cost reduction and narrow frame design.

What is described above is only specific embodiments of the present disclosure, but the protection scope of the present disclosure is not limited thereto. Any person skilled in the art may readily think of variations or alternatives within the technology scope disclosed by the present disclosure, which should all be contained in the protection scope of the present disclosure. Therefore, the protection scope of the present disclosure should be in accordance with the claimed protection scope.

The invention claimed is:

1. A shift register unit including: a reset signal sub-unit and a scan signal sub-unit;
    wherein, the reset signal sub-unit includes: a first input module, a first output module, and a first control module;
    the first input module being connected with a signal input terminal, a first clock signal terminal, the first control module, and the first output module, used for outputting a signal at the signal input terminal to the first output module and the first control module under the control of the first clock signal terminal;
    the first output module being also connected with a second clock signal terminal, a first voltage terminal, a reset signal terminal, and the scan signal sub-unit, used for outputting a signal at the second clock signal terminal to the scan signal sub-unit and the reset signal terminal under the control of the first voltage terminal and the first input module;
    the first control module being also connected with the first voltage terminal, the first clock signal terminal, a second voltage terminal, the reset signal terminal, and the scan signal sub-unit, used for outputting a voltage signal at the second voltage terminal to the scan signal sub-unit and the reset signal terminal under the control of the first voltage terminal, the first clock signal terminal and the first input module;
    the scan signal sub-unit includes: a second input module, a second output module, and a second control module;

the second input module being connected with the first output module, the first control module, the reset signal terminal, the second clock signal terminal, the second output module, and the second control module, used for outputting a signal at the first output module, the first control module, or the reset signal terminal to the second output module and the second control module under the control of the second clock signal terminal;

the second output module being also connected with the first clock signal terminal, the first voltage terminal, and a signal output terminal, used for outputting a signal at the first clock signal terminal to the signal output terminal under the control of the first voltage terminal and the second input module;

the second control module being also connected with the second voltage terminal, the first voltage terminal, the second clock signal terminal, and the signal output terminal, used for outputting a voltage signal at the second voltage terminal to the signal output terminal under the control of the first voltage terminal, the second clock signal terminal, and the second input module.

2. The shift register unit of claim 1, wherein the first input module includes: a first transistor, having a gate connected with the first clock signal terminal, a first electrode connected with the signal input terminal, and a second electrode connected with the first output module and the first control module.

3. The shift register unit of claim 1, wherein the first output module includes: a second transistor, a third transistor, and a first capacitor;

the second transistor having a gate connected with the first voltage terminal, a first electrode connected with the first input module, and a second electrode connected with a gate of the third transistor;

the third transistor having a first electrode connected with the second clock signal terminal and a second electrode connected with the scan signal sub-unit and the reset signal terminal;

the first capacitor having one terminal connected with the gate of the third transistor, and another terminal connected with the second electrode of the third transistor.

4. The shift register unit of claim 1, wherein the first control module includes: a fourth transistor, a fifth transistor, a sixth transistor, and a second capacitor;

the fourth transistor having a gate connected with the first input module, a first electrode connected with the first clock signal terminal, and a second electrode connected with a second electrode of the fifth transistor;

the fifth transistor having a gate connected with the first clock signal terminal and a first electrode connected with the first voltage terminal;

the sixth transistor having a gate connected with the second electrode of the fourth transistor, a first electrode connected with the second voltage terminal, and a second electrode connected with the scan signal sub-unit and the reset signal terminal;

the second capacitor having one terminal connected with the gate of the sixth transistor and another terminal connected with the first electrode of the sixth transistor.

5. The shift register unit of claim 1, wherein the second input module includes:

a seventh transistor, having a gate connected with the second clock signal terminal, and a first electrode connected with the first output module, the first control module, and the reset signal terminal.

6. The shift register unit of claim 1, wherein the second output module includes: a eighth transistor, a ninth transistor, and a third capacitor;

the eighth transistor having a gate connected with the first voltage terminal, a first electrode connected with the second input module, and a second connected with a gate of the ninth transistor;

the ninth transistor having a first electrode connected with the first clock signal terminal, and a second connected with the signal output terminal;

the third capacitor having one terminal connected with the gate of the ninth transistor and another terminal connected with the second electrode of the ninth transistor.

7. The shift register unit of claim 1, wherein the second control module includes: a tenth transistor, an eleventh transistor, a twelfth transistor, and a fourth capacitor;

the tenth transistor having a gate connected with the second input module, a first electrode connected with the second clock signal terminal, and a second electrode connected with a second electrode of the eleventh transistor;

the eleventh transistor having a gate connected with the second clock signal terminal and a first electrode connected with the first voltage terminal;

the twelfth transistor having a gate connected with the second electrode of the tenth transistor, a first electrode connected with the second voltage terminal, and a second electrode connected with the signal output terminal;

the fourth capacitor having one terminal connected with the gate of the twelfth transistor and another terminal connected with the first electrode of the twelfth transistor.

8. A gate driving circuit, including at least two stages of shift register units, each of which is the shift register unit of claim 1;

a first stage of shift register unit in the at least two stages of shift register units having a signal input terminal connected with an initial signal terminal;

except the first stage of shift register unit, every other shift register unit in the at least two stages of shift register units having a signal input terminal connected with a signal output terminal of its adjacent previous stage of shift register unit.

9. The gate driving circuit of claim 8, wherein the first input module includes:

a first transistor, having a gate connected with the first clock signal terminal, a first electrode connected with the signal input terminal, and a second electrode connected with the first output module and the first control module.

10. The gate driving circuit of claim 8, wherein the first output module includes: a second transistor, a third transistor, and a first capacitor;

the second transistor having a gate connected with the first voltage terminal, a first electrode connected with the first input module, and a second electrode connected with a gate of the third transistor;

the third transistor having a first electrode connected with the second clock signal terminal and a second electrode connected with the scan signal sub-unit and the reset signal terminal;

the first capacitor having one terminal connected with the gate of the third transistor, and another terminal connected with the second electrode of the third transistor.

11. The gate driving circuit of claim 8, wherein the first control module includes: a fourth transistor, a fifth transistor, a sixth transistor, and a second capacitor;
  the fourth transistor having a gate connected with the first input module, a first electrode connected with the first clock signal terminal, and a second electrode connected with a second electrode of the fifth transistor;
  the fifth transistor having a gate connected with the first clock signal terminal and a first electrode connected with the first voltage terminal;
  the sixth transistor having a gate connected with the second electrode of the fourth transistor, a first electrode connected with the second voltage terminal, and a second electrode connected with the scan signal sub-unit and the reset signal terminal;
  the second capacitor having one terminal connected with the gate of the sixth transistor and another terminal connected with the first electrode of the sixth transistor.

12. The gate driving circuit of claim 8, wherein the second input module includes:
  a seventh transistor, having a gate connected with the second clock signal terminal, and a first electrode connected with the first output module, the first control module, and the reset signal terminal.

13. The gate driving circuit of claim 8, wherein the second output module includes: a eighth transistor, a ninth transistor, and a third capacitor;
  the eighth transistor having a gate connected with the first voltage terminal, a first electrode connected with the second input module, and a second connected with a gate of the ninth transistor;
  the ninth transistor having a first electrode connected with the first clock signal terminal, and a second connected with the signal output terminal;
  the third capacitor having one terminal connected with the gate of the ninth transistor and another terminal connected with the second electrode of the ninth transistor.

14. The gate driving circuit of claim 8, wherein the second control module includes: a tenth transistor, an eleventh transistor, a twelfth transistor, and a fourth capacitor;
  the tenth transistor having a gate connected with the second input module, a first electrode connected with the second clock signal terminal, and a second electrode connected with a second electrode of the eleventh transistor;
  the eleventh transistor having a gate connected with the second clock signal terminal and a first electrode connected with the first voltage terminal;
  the twelfth transistor having a gate connected with the second electrode of the tenth transistor, a first electrode connected with the second voltage terminal, and a second electrode connected with the signal output terminal;
  the fourth capacitor having one terminal connected with the gate of the twelfth transistor and another terminal connected with the first electrode of the twelfth transistor.

15. A display apparatus, including the gate driving circuit of claim 8.

16. The display apparatus of claim 15, wherein the first input module includes:
  a first transistor, having a gate connected with the first clock signal terminal, a first electrode connected with the signal input terminal, and a second electrode connected with the first output module and the first control module.

17. The display apparatus of claim 15, wherein the first output module includes: a second transistor, a third transistor, and a first capacitor;
  the second transistor having a gate connected with the first voltage terminal, a first electrode connected with the first input module, and a second electrode connected with a gate of the third transistor;
  the third transistor having a first electrode connected with the second clock signal terminal and a second electrode connected with the scan signal sub-unit and the reset signal terminal;
  the first capacitor having one terminal connected with the gate of the third transistor, and another terminal connected with the second electrode of the third transistor.

18. The display apparatus of claim 15, wherein the first control module includes: a fourth transistor, a fifth transistor, a sixth transistor, and a second capacitor;
  the fourth transistor having a gate connected with the first input module, a first electrode connected with the first clock signal terminal, and a second electrode connected with a second electrode of the fifth transistor;
  the fifth transistor having a gate connected with the first clock signal terminal and a first electrode connected with the first voltage terminal;
  the sixth transistor having a gate connected with the second electrode of the fourth transistor, a first electrode connected with the second voltage terminal, and a second electrode connected with the scan signal sub-unit and the reset signal terminal;
  the second capacitor having one terminal connected with the gate of the sixth transistor and another terminal connected with the first electrode of the sixth transistor.

19. The display apparatus of claim 15, wherein the second input module includes:
  a seventh transistor, having a gate connected with the second clock signal terminal, and a first electrode connected with the first output module, the first control module, and the reset signal terminal.

20. A driving method of a shift register unit, the shift register unit including a reset signal sub-unit and a scan signal sub-unit, the reset signal sub-unit including a first input module, a first output module, and a first control module, and the scan signal sub-unit including a second input module, a second output module, and a second control module, and the driving method including:
  a first phase, a first input module outputting a signal at a signal input terminal to a first output module and a first control module; the first output module storing a signal at the signal input terminal and outputting a signal at a second clock signal terminal to a second input module and a reset signal terminal; the first control module storing a signal at a first clock signal terminal and outputting a voltage signal at a second voltage terminal to the second input module and the reset signal terminal; the second input module being turned off with no signal inputted to a second output module and a second control module and no signal outputted at a signal output terminal;
  a second phase, the first input module being turned off, and the first output module outputting a signal at the second clock signal terminal to the second input module and the reset signal terminal under the control of the signal stored in the first phase; the first control module having no signal to output to the second input module and the reset signal terminal; the second input module outputting a received signal at the second clock signal terminal to the second output module and the second control module; the second output module storing a signal at the second clock signal terminal and outputting a signal at the first clock signal terminal to the signal output terminal under the control of the second clock signal terminal; the second control module storing a signal at the second clock signal terminal and outputting a voltage signal at the second voltage terminal to the signal output terminal under the control of the second clock signal terminal;

a third phase, the first input module outputting a signal at the signal input terminal to the first output module and the first control module; the first output module storing a signal at the signal input terminal; the first control module storing a voltage signal at the first voltage terminal and outputting a voltage signal at the second voltage terminal to the second input module and the reset signal terminal under the control of the first voltage terminal; the second input module being turned off, and the second output module outputting a signal at the first clock signal terminal to the signal output terminal under the control of the signal stored in the second phase; the second control module having no signal to output to the signal output terminal;

a fourth phase, the first input module being turned off, and the first output module having no signal to output to the second input module under the control of the signal stored in the third phase; the first control module storing a voltage signal at the first voltage terminal under the control of the first clock signal terminal and outputting a voltage signal at the second voltage terminal to the second input module and the reset signal terminal under the control of the first voltage terminal; the second input module outputting a received signal at the second voltage terminal to the second output module and the second control module; the second output module having no signal to output to the signal output terminal under the control of the second voltage terminal; the second control module outputting a signal at the second voltage terminal to the signal output terminal under the control of the second voltage terminal and the first voltage terminal.

* * * * *